United States Patent [19]

Malissin et al.

[11] 4,238,707
[45] Dec. 9, 1980

[54] POWER SUPPLY SYSTEM FOR A SEMICONDUCTOR LIGHT SOURCE

[75] Inventors: Roland Malissin; Daniel Lecomte, both of Paris, France

[73] Assignee: Thomson-CSF, Paris, France

[21] Appl. No.: 2,307

[22] Filed: Jan. 10, 1979

[30] Foreign Application Priority Data

Jan. 20, 1978 [FR] France .................. 78 01637

[51] Int. Cl.³ .................. H05B 37/02; H01S 3/096
[52] U.S. Cl. .................. 315/175; 315/151; 315/159; 315/245; 315/309; 331/94.5 PE
[58] Field of Search .............. 315/151, 156, 158, 159, 315/171, 173, 175, 245, 307, 309, 360; 250/205; 331/94.5 H, 94.5 PE

[56] References Cited

U.S. PATENT DOCUMENTS

| 3,931,513 | 1/1976 | Germain | 315/151 X |
| 4,071,806 | 1/1978 | List | 315/171 X |
| 4,160,934 | 7/1979 | Kirsch | 315/307 |

Primary Examiner—Eugene R. LaRoche
Attorney, Agent, or Firm—Cushman, Darby & Cushman

[57] ABSTRACT

The invention relates to a power supply system for a semiconductor light source of which the power is regulated in the steady state by a regulating loop comprising an electronic switching circuit controlled by a signal characteristic of the power emitted by the laser which closes the regulating loop when the output power has reached, a threshold power, a ramp generator supplying a ramp of current to the laser solely from the instant when the feed voltage is established for reaching the threshold.

11 Claims, 3 Drawing Figures

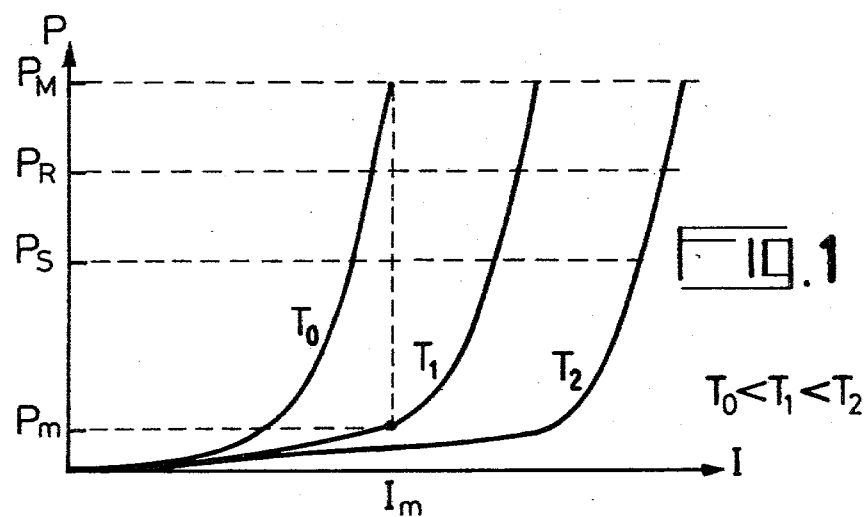
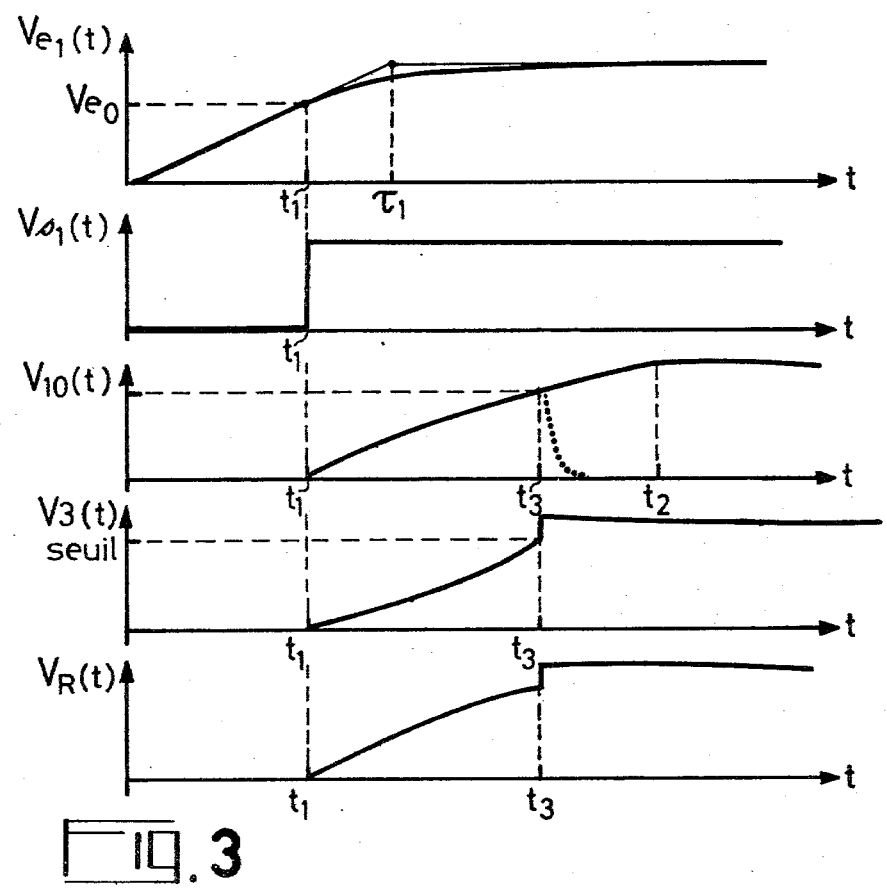

POWER SUPPLY SYSTEM FOR A SEMICONDUCTOR LIGHT SOURCE

BACKGROUND OF THE INVENTION

1. Field of the Invention

This invention relates to light sources based on semiconductors, semiconductor lasers or light-emitting diodes (LED) and, more particularly, to an improved power-supply system both for switching the source on or off and for operation in the steady state.

Several problems are involved in supplying power to semiconductor sources. In the steady state, it is necessary to provide the source with a power supply system comprising a regulating device to enable the power output of the source to be kept substantially constant. In addition, when the power supply system is switched on, it is necessary to provide a device which enables the source to arrive progressively at its operating state. Finally, when the source is switched on or off, the parasitic pulses emanating from the electronic circuits must not reach the source which is in danger of being damaged by the effect of these parasitic pulses.

Other precautions have to be taken for supplying power to semiconductor power lasers when these lasers are intended to operate in wide temperature ranges. Although it is known that a device for thermally regulating the laser by acting on its temperature by means of a frigatron can be used in arrangements such as these, a device of this type only provides for slow regulation.

Low-power lasers (below 5 mW) which operate at or around ambient temperature (i.e. at temperatures below 60° C.) do not require thermal regulating devices because, at temperatures of this order, there is no risk of damage to the laser. Accordingly, it is possible to regulate the power emitted by the laser solely by varying the feed current.

2. Description of the Prior Art

Known of the prior art (thermal or electronic) comprise a photoelectric cell which supplied a signal characteristic of the variations in the power emitted by the laser by extracting part of the radiation emitted by the laser which is either a part of the radiation emitted frontwards in the propagation direction or the radiation emitted towards the rear of the semiconductor.

SUMMARY OF THE INVENTION

The present invention relates to a power supply system for a semiconductor light source comprising an electrical regulating device for keeping the output power of this source constant or variable according to control pulses around a constant mean value, by acting on its feed current in the operating state and for establishing this operating state without any of the disadvantages referred to above, in particular the parasitic pulses and the transitory phenomena. A thermal regulating device may also be provided in cases where it is desired to extend the operating temperature range, the electrical regulating device enabling the response speed of the thermal regulating loop to be increased.

BRIEF DESCRIPTION OF THE DRAWINGS

For a better understanding of the invention and to show how the same may be carried into effect, reference will be made to the following description and the attached drawings among which:

FIG. 1 shows a group of curves representing the variations in the power emitted by a semiconductor laser as a function of the feed current at different temperatures;

FIG. 3 diagrammatically illustrates the signals present at various points of the power supply system as a function of time.

DETAILED DESCRIPTION OF THE PREFERRED EMBODIMENT

Figure 2:
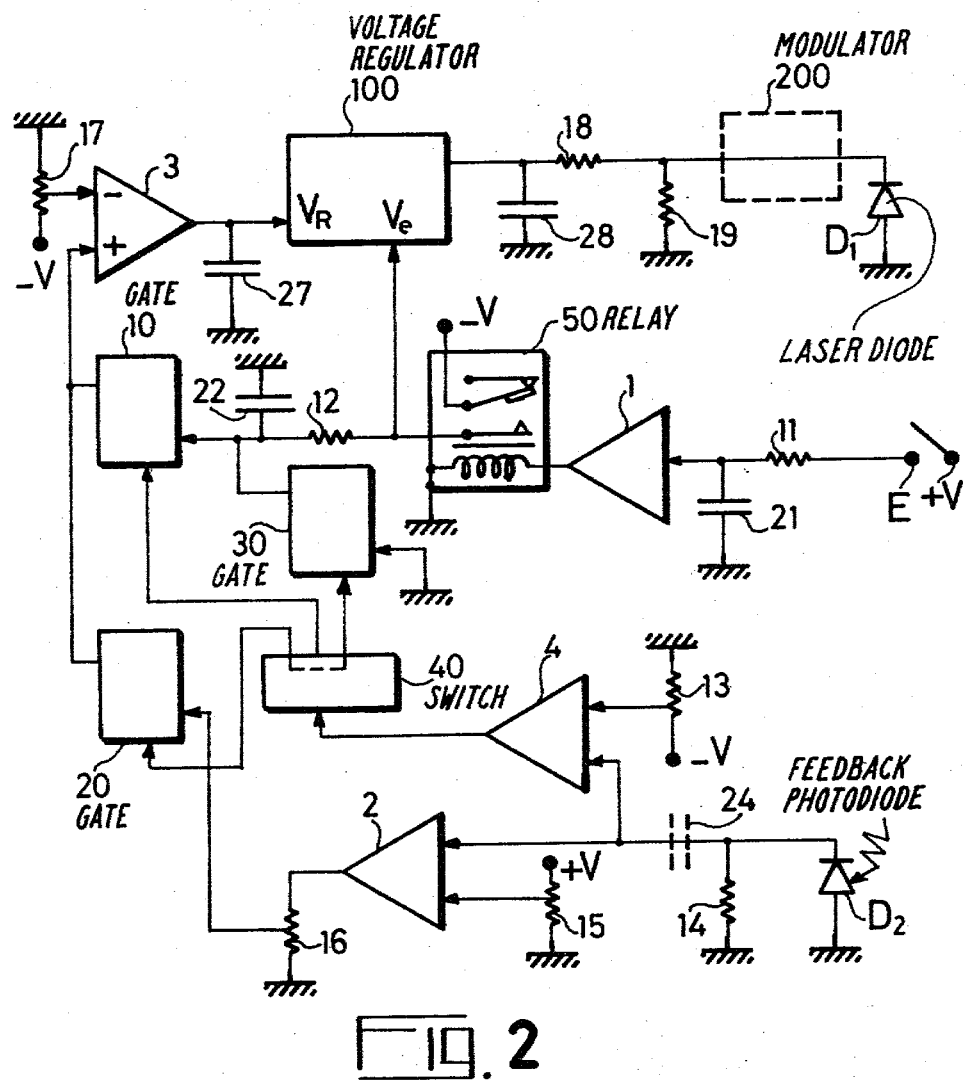
FIG. 2 diagrammatically illustrates the system according to the invention for supplying a semiconductor laser source.

Although the following description relates to a semiconductor laser, it is by no means limited to this type of light source and is also applicable to light-emitting diodes (LED.)

FIG. 1 shows the variation in the power P emitted by the laser as a function of the feed current I at a constant temperature for three different temperatures $T_o$, $T_1$ and $T_2$ such that $T_o < T_1 < T_2$.

In order to avoid faults in the operation of the laser when voltage is applied to it, the feed circuits deliver a control voltage ramp to the laser. This ramp starts from a minimum voltage value $V_m$ such that, at the lowest operating of the laser, the current does not exceed the threshold $I_m$ corresponding to the maximum permitted power $P_M$ of the laser. The curves show that, if the current $I_m$ is fixed, the maximum output power $P_M$ will be reached at the temperature $T_o$. In addition, in this drawing the power $P_S$ is the threshold power of the laser beyond which the transitory state is considered as terminated and $P_R$ is the power to which the semiconductor laser is regulated.

FIG. 2 diagrammatically illustrates the power supply system of the laser comprising an automatic electronic switching device which closes a power regulating loop after the transitory state, the laser being fed during the transitory state by a voltage ramp. The semiconductor laser is diagrammatically represented in FIG. 2 by an emitting laser diode $D_1$. This semiconductor laser is fed by a voltage regulator 100 of which the output is connected to the diode $D_1$ through a filter circuit formed by the capacitor 28 and the resistor 18 and a resistor 19 connected in parallel with the diode $D_1$. The filter circuit reduces the effect of parasitic pulses which could arrive at this point of the power supply system whilst the resistor 19 is a load which prevents the formation of pulses when the power supply system of the laser is disconnected.

The regulator 100 is such that, at its output, it transmits a signal $V_s$ which is the input signal $V_e$ regulated by means of a reference signal $V_R$. The power supply system is designed in such a way that an input signal $V_e$ is only applied to the regulator after a sufficient period following the application of voltage to the circuits so that the signal has an already stabilised level. A delay system ensures that $V_e$ is only applied after a time $t_1$. To this end, the input signal, which is the feed voltage $+V$ applied to the terminal E, is transmitted to an amplifier 1 through a circuit formed by a resistor 11 and a capacitor 21 having a time contant $\tau_1$. The output of the amplifier, which operates on the all-or-nothing principle, is connected to the input of the winding of a relay 50 which, at its other end, is connected to earth. The relay is fed by the amplifier circuit 1. When the threshold voltage $V_{eo}$ is established at the input of this circuit after $t_{11} < \tau_1$, the voltage $-V$ is applied to the input terminal of the regulator.

The reference signal $V_R$ applied to the reference input of the regulator 100 is the output signal of an amplifier 3 of which the level is adjustable by a potentiometer 17 connected between earth and the potential $-V$ and to the "$-$" input of the amplifier 3. The "$+$" terminal of this amplifier receives the useful signal intended for regulation either by a first channel which terminates in a gate 10 or by a second channel which terminates in a gate 20. These two gates are controlled by a switch circuit 40 and are respectively open and closed during the phase corresponding to the transitory state and vice versa during the phase corresponding to the steady state.

During the transitory phase, the signal required for regulation is supplied by the first channel, the gate 10 then being open. This channel utilises the output signal of the relay 50 applied to the signal input of the regulator 100, i.e. a constant signal of level $-V$ present from the instant $t_1$. This signal is applied to a circuit formed by a resistor 12 and a capacitor 22 having a time constant $\tau_2$. The output of this circuit delivers to the input of the gate 10 a voltage ramp which starts from zero at the instant $t=t_1$ and which is near its maximum at the instant $t_2=t_1+\tau_2$. The gate 10 transmits this signal to the input of the amplifier 3 and, hence, to the reference input of the regulator as long as this gate is open. A capacitor 27 is connected between the output of the amplifier 3 and earth and, with the output impedance of the amplifier, forms a filter circuit which eliminates the parasitic pulses capable of being formed in the circuit, particularly during the opening and closing of the gates.

This first channel supplied the reference signal to the regulator for as long as the operating state is not established. When the operating state is established, the regulator is controlled by a signal coming from the second channel. This channel is the negative feedback loop for regulating the power of the laser. It is controlled by a signal emanating from a photoelectric cell operating either in the photovoltaic mode or in the photoconductive mode and positioned for example to intercept the radiation emitted by the rear face of the semiconductor. In FIG. 2, this photoelectric cell is shown in the form of a feedback photodiode $D_2$ which delivers an electrical current. A resistor 14 connected to the terminals of the photocell supplies a voltage $V_4$ which is applied on the one hand to the input of an amplifier 2 of which the other input is connected to a potentiometer 15 which is connected between earth and the potential $+V$ and of which the output is connected to one terminal of a potentiometer 16 for regulating the gain of the loop, the other terminal of this potentiometer being connected to earth. The moving terminal is connected to the signal input of the gate 20 which is controlled by a switch circuit 40, as mentioned above. The control circuit of the switch 40 also uses the voltage $V_4$ which is developed at the terminals of the resistor 14. This voltage is applied to the input of the threshold amplifier 4 of which the threshold is fixed by a potentiometer 13 which is connected between earth and $-V$ and of which the moving terminal is connected to the reference input of the threshold amplifier 4. The potentiometer 13 regulates the threshold beyond which the feedback loop of the laser is closed, i.e. the threshold power $P_S$ sufficient for the device to have reached the end of the transitory phase from which an operating state may be established with regulation of the power output.

FIG. 3 shows the signals present at various points of the system as a function of time.

The first signal shown $V_{e1}(t)$ is the signal at the input of the amplifier 1. At the instant $t_1$, the output signal of the amplifier 1, $V_{s1}$, changes level, the relay flips and the corresponding signal $-V$ is applied to the signal input of the regulator 100. At the same time, the gate 10 is opened. The signal present at the input of this gate $V_{10}(t)$ is shown in FIG. 3. It is a voltage ramp which starts from zero at the instant $t_1$ and reaches a value close to the maximum at $t_2=t_1+\tau_2$ and which is also the signal $V_R(t)$ applied to the reference input of the regulator (except the level) up to the instant $t=t_3$. This instant $t_3$ is determined by the threshold amplifier which controls the operation of the gates 10 and 20, opening the gate 20 and closing the gate 10. The signal $V_3(t)$ at the input of the threshold amplifier 4 is also shown in FIG. 3. This signal starts from zero at the instant $t_1$ (from the instant when the laser begins to emit) and increases. The regulating signal at the output of the amplifier 2 is proportional to this signal $V_3(t)$. The signal $V_R(t)$ applied to the reference input of the regulator is a signal proportional to $V_3(t)$ from $t=t_3$.

FIG. 2 shows a gate 30 open at the same time as the gate 20. This gate, which is connected to earth, enables the capacitor 22 to discharge at the end of the transitory period as shown by the dotted line in FIG. 3, $V_{10}(t)$ decreasing from $t=t_3$. This is because if, as a result of incorrect operation, the regulating loop were open, the first channel would simultaneously be validated and the maximum voltage of the ramp ($-V$) would be applied to the laser and could damage it. By contrast, the circuit provided enables the capacitor to discharge rapidly before the maximum voltage is established.

A certain number of improvements may be made to the system illustrated in FIG. 2, in particular for reducing the effect of variations in temperature. This is because the sensitivity of the photoelectric cell, represented by the diode $D_2$, increases as a function of temperature and, if the cell is charged by an ordinary resistor 14, the control signal increasing, the regulator tends to reduce the power output of the laser.

In order to overcome the variations in sensitivity of the photoelectric cell, the resistor 14 is replaced by a circuit of ordinary resistors and resistors having a negative temperature coefficient of which the total resistance varies as a function of temperature under a law substantially opposite to that governing the variations in sensitivity. Thus, the power emitted by the laser is independent of the effect of these variations in temperature on the cell. Similarly, the resistor 17 in the system shown in FIG. 2 is adjusted in such a way that the initial value of the voltage of the control ramp of the laser and, hence, the corresponding current does not exceed a threshold $I_m$ fixed by the maximum permitted power of the laser at the lowest temperature of the operating range, as shown by the group of curves in FIG. 1. In order to overcome this limitation, it is possible to replace the potentiometer 17 by a circuit of ordinary resistors and resistors having a negative temperature coefficient such that, at the temperature of the laser (or at the ambient temperature in the case of a low-power laser), the current $I_m$ decreases when the temperature decreases and vice versa.

In addition, the described system is a power supply system for a non-modulated semiconductor laser. For a semiconductor laser intended to operate by pulsation, the circuit shown in FIG. 2 has to be modified on the one hand by adding between the output of the regulator and the laser a modulator 200 which delivers the control pulses to the laser, these pulses having a regulated level. To this end, the photodiode D$_2$ is followed by a circuit formed by a resistor 14 and a capacitor 24 which delivers the peak signal of the laser. These elements (modulator 200 and capacitor 24) are shown in dotted lines in FIG. 2.

The invention is by no means limited to the embodiment described and illustrated. In particular, the role of the resistor-capacitor circuit 11, 21 with the time constant $\tau_1$ may be filled by the power supply system itself providing there is a build-up time in operation. In addition, the resistor-capacitor circuit 12, 22 may be replaced by a ramp generator which returns to zero and remains there after the maximum of the ramp has been reached. In this case, the gate 30 intended for discharging the capacitor 22 is redundant.

Finally, the relay 50 is placed between the input of the power supply system and the input of the regulator 100 for breaking the input connection for as long as a certain threshold voltage is not reached so that the laser is not supplied with power. It is also possible in accordance with the invention to interrupt the connection between the output of the regulator 100 and the laser by placing the relay in this connection.

The power supply system shown in FIG. 2, in which the resistor 14, D$_1$ and D$_2$ are in fact accomodated in the same place, enables a regulation better than 1% to be obtained without any particular precautions having to be taken either when the laser is switched on or off or when it is operating in the steady state in an ambient temperature range from 20° C. to 60° C.

In order to extend the operating temperature range, particularly for power semiconductor lasers, the power supply system of the laser will comprise, in addition to the electrical regulating loop controlled by a signal characteristic of the power emitted by the laser, a thermal regulating loop which uses a thermal sensor so that this loop is independent of the power output of the laser. With an arrangement such as this, it is possible on the one hand to keep the laser at a sufficiently low temperature for a long service life and, on the other hand, to regulate its power output.

The invention may be used for example for supplying power to semiconductor lasers for recording or reading optically recordable or readable videodiscs or for supplying power to optical telecommunications systems.

What we claim is:

1. A power supply system for a semiconductor light source comprising:
   a power regulating circuit having the output thereof controlled by a signal characteristic of the power emitted by said source;
   a control circuit for said source having an output connected to said source for providing a control current;
   a ramp generator;
   a switching circuit having a first input, a second input, a control input and an output, said ramp generator being connected to said first input of said switching circuit, said output of said regulating circuit being connected to said second input of said switching circuit, the output of said switching circuit being connected to the input of said control circuit, and said control input of said switching circuit being connected to the output of said regulating circuit, said switching circuit being responsive to the signal applied to said control input for connecting the output of said switching circuit to said first input during a transitory phase and to said second input during a steady phase, the end of said transitory phase being determined when a predetermined threshold in the emitted power is reached.

2. A system as claimed in claim 1, wherein a photosensitive cell intended to intercept a fraction of the radiation emitted by said source delivers said signal characteristic of the power emitted, said regulating circuit comprising a load impedance at the terminals of said cell comprising a resistor having a negative temperature coefficient for compensating the variations in sensitivity of said cell as a function of temperature.

3. A system as claimed in claim 2 further comprising means for supplying to said control circuit a signal of which the starting level is fixed, said fixed starting-level signal supplying means including a resistive circuit of which the resistance varies as a function of temperature to avoid exceeding the maximum permitted power level of said source by increasing and decreasing said control current when the temperature respectively increases and decreases.

4. A system as claimed in claim 3, further comprising a device for releasing the ramp generator, said device being controlled by the application of voltage to the power supply system and having a delay time corresponding to the buildup time of the voltage at the output of said system.

5. A system as claimed in claim 1, wherein said semiconductor light source is a laser source.

6. A system as claimed in claim 1, wherein said semiconductor light source is a light-emitting diode.

7. A regulated power supply for a light source comprising:
   means for sensing the output characteristics of said light source;
   means for obtaining a signal of increasing magnitude;
   means responsive to said sensing means for selectively providing at the output thereof one of said signal of increasing magnitude and a signal indicative of said output characteristics; and
   means responsive to the output of said selective providing means for supplying a control current to said light source.

8. The regulated power supply as in claim 7 further comprising means for adjusting the initial level of said control current to avoid exceeding the maximum power level of said light source.

9. The regulated power supply as in claim 8 further comprising means for initiating the operation of said regulated power supply, said initiating means being operative to delay initiation of the operation of said regulated power supply for a predetermined period after activation to allow the circuits of said regulated power supply to stabilize.

10. The regulated power supply as in claim 7 or 9 wherein said sensing means comprises a photosensitive diode connected in parallel with a resistor, said resistor having a negative temperature coefficient for compensating for the temperature variations of said photosensitive diode.

11. The regulated power supply as in claim 7 or 9 wherein said means for obtaining a signal of increasing magnitude comprises ramp signal generating means and means for resetting said ramp signal generating means when said selective providing means provides said signal indicative of said output characteristics.

* * * * *